United States Patent
Wu et al.

(10) Patent No.: US 6,765,301 B2
(45) Date of Patent: Jul. 20, 2004

(54) INTEGRATED CIRCUIT BONDING DEVICE AND MANUFACTURING METHOD THEREOF

(75) Inventors: Chung-Ju Wu, Kaohsiung (TW); Kuei-Chen Liang, Hsinchu (TW); Wei-Feng Lin, Hsinchu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/212,106

(22) Filed: Aug. 6, 2002

(65) Prior Publication Data

US 2003/0094703 A1 May 22, 2003

(30) Foreign Application Priority Data

Nov. 22, 2001 (TW) ........................................ 90128925 A

(51) Int. Cl.[7] .............................................. H01L 23/48
(52) U.S. Cl. ........................ 257/782; 257/784; 257/690; 257/691; 257/692; 257/786
(58) Field of Search ................................ 257/690, 691, 257/692, 698, 782, 784, 459, 786; 438/617, 612, 666

(56) References Cited

U.S. PATENT DOCUMENTS

| | | | | |
|---|---|---|---|---|
| 5,457,340 A | * | 10/1995 | Templeton, Jr. et al. | 257/666 |
| 5,801,440 A | * | 9/1998 | Chu et al. | 257/691 |
| 6,054,767 A | * | 4/2000 | Chia et al. | 257/738 |
| 6,291,898 B1 | * | 9/2001 | Yeh et al. | 257/786 |
| 6,476,472 B1 | * | 11/2002 | Davison et al. | 257/678 |
| 6,477,046 B1 | * | 11/2002 | Stearns et al. | 257/712 |
| 6,489,682 B1 | * | 12/2002 | Yet et al. | 257/738 |
| 6,534,879 B2 | * | 3/2003 | Terui | 257/786 |
| 6,570,249 B1 | * | 5/2003 | Liao et al. | 257/724 |

* cited by examiner

Primary Examiner—Steven Loke
Assistant Examiner—Quang Vu
(74) Attorney, Agent, or Firm—Birch, Stewart, Kolasch & Birch, LLP

(57) ABSTRACT

An integrated circuit device. The substrate includes a signal connection point and two shielding connection points set at the two sides of the signal connection point. The chip is set on the substrate. There are a signal pad and two shielding pads set at the two sides of the signal pad on the edge of the chip. The signal wire bonding is coupled to the signal connection point and the signal pad. Two shielding wire bondings are coupled to the shielding connection points and the shielding pads and extend along both sides of the signal wire bonding. The signal trace line is set on the substrate and coupled to the signal connection point. The power ring circuit is set on the substrate and coupled to the shielding connection points. The power circuit includes two shielding lines extending along both sides of the signal trace line.

4 Claims, 2 Drawing Sheets

INTEGRATED CIRCUIT BONDING DEVICE AND MANUFACTURING METHOD THEREOF

BACKGROUND OF THE INVENTION

1. Field of the Invention

The present invention relates to an integrated circuit bonding device and a manufacturing method thereof, particularly to an integrated circuit bonding device with highly integrated signal trace lines immune from noise and a manufacturing method thereof.

2. Description of the Related Art

In an integrated circuit manufacturing process, gold lines are bonded between pads on a chip and fingers on a substrate before molding. Thus, the solder balls or pins, connection points hereinafter, of the substrate for connection and signal transmission with external circuits are electrically connected to the pads of the chip.

FIG. 1 is a diagram showing a conventional integrated circuit with bonded gold lines arranged. The integrated circuit comprises a substrate 10, a chip 12 and gold lines 14A, 14B, and 14C. The chip 12 has pads 16A, 16B, and 16C to output signals comprising strobe signals, clock signals, power signals, and ground. The signals are connected to the connecting points 17A, 17B, and 17C of the substrate 10 through gold lines 14A, 14B, and 14C, then connected to other circuits by lines 18A and 18B through via 19A, and 19B or only by line 18C.

The ground ring 15A and power ring 15B surround the chip 12. The power circuit composed by the ground ring 15A and power ring 15B provides the necessary power for chip 12 to operate.

However, noise is easily generated in each signal trace line carrying high frequency signals such as the clock, strobe, and data signals since they interfere with each other. Interfered signals cause failure in chip 12. Therefore, the bonding and layout of the circuit have to be modified to decrease the interference between the signals to improve the reliability of the circuit.

SUMMARY OF THE INVENTION

The object of the present invention is to provide an integrated circuit bonding device and a manufacturing method thereof. The signal trace lines transmitting important signals are shielded by the metal lines transmitting the power or ground signals from the pad of the chip to the substrate and follow-up circuits. Because the signal in the power line or ground line is stable and has a stronger electric current, the electromagnetic waves generated from the adjacent signal trace lines are attracted to the power line or ground line. Therefore, the important signals are not interfered with by the adjacent signal trace lines. Using the power line or ground line to shielding metal lines with important signals to solve the interference between the signals and combining the design of the position of pads, the quality of signals is improved.

To achieve the above-mentioned object, the present invention provides an integrated circuit bonding device. The substrate includes a signal connection point and two shielding connection points set at the two sides of the signal connection point. The chip is set on the substrate. There are a signal pad and two shielding pads set at the two sides of the signal pad on the edge of the chip. The signal gold line is coupled to the signal connection point and the signal pad. Two shielding gold lines are coupled to the shielding connection points and the shielding pads and extend along both sides of the signal gold line. The signal trace line is set on the substrate and coupled to the signal connection point. The power circuit is set on the substrate and coupled to the shielding connection points. The power circuit includes two shielding lines extending along both sides of the signal trace line.

In addition, the present invention provides a method to manufacture an integrated circuit device. First, a substrate and a chip are provided. Next, a signal pad is formed on the chip. Two shielding pads are formed at both sides of the signal pad on the edge of the chip. Two shielding connection points are formed on the substrate responding to the shielding pads. Then, a signal connection point is formed between the shielding connection points. Next, a signal trace line is formed for coupled to the signal connection point. A signal gold line is formed for coupled to the signal pad and the signal connection point. Next, two shielding gold lines are formed for coupled to the shielding pads and the shielding connection point and extending along both sides of the signal gold line. Finally, a power circuit comprising two shielding lines extending along both sides of the signal trace line is formed on the substrate.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
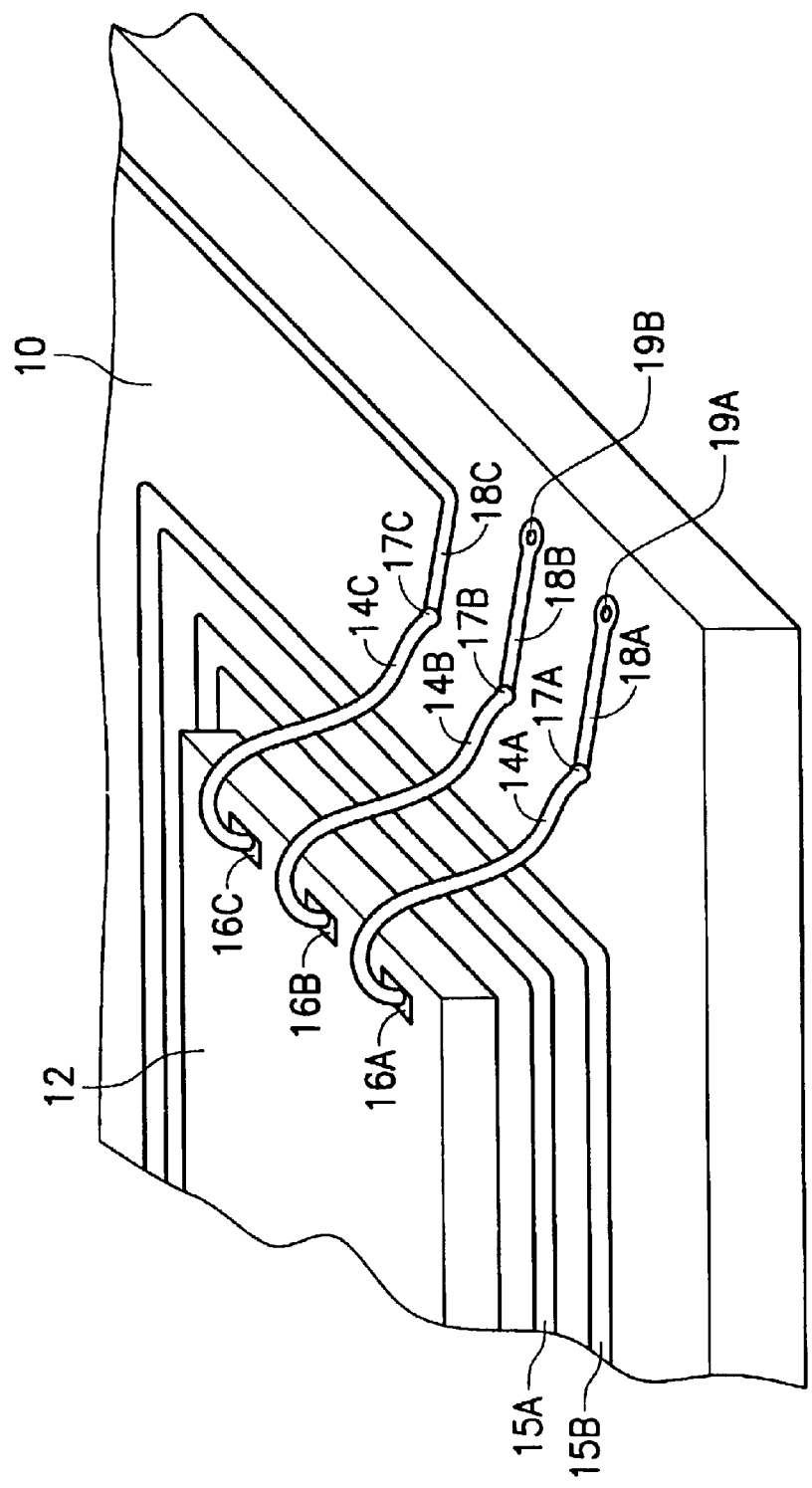
FIG. 1 is a diagram showing a conventional integrated circuit with bonded gold lines arranged.
Figure 2:
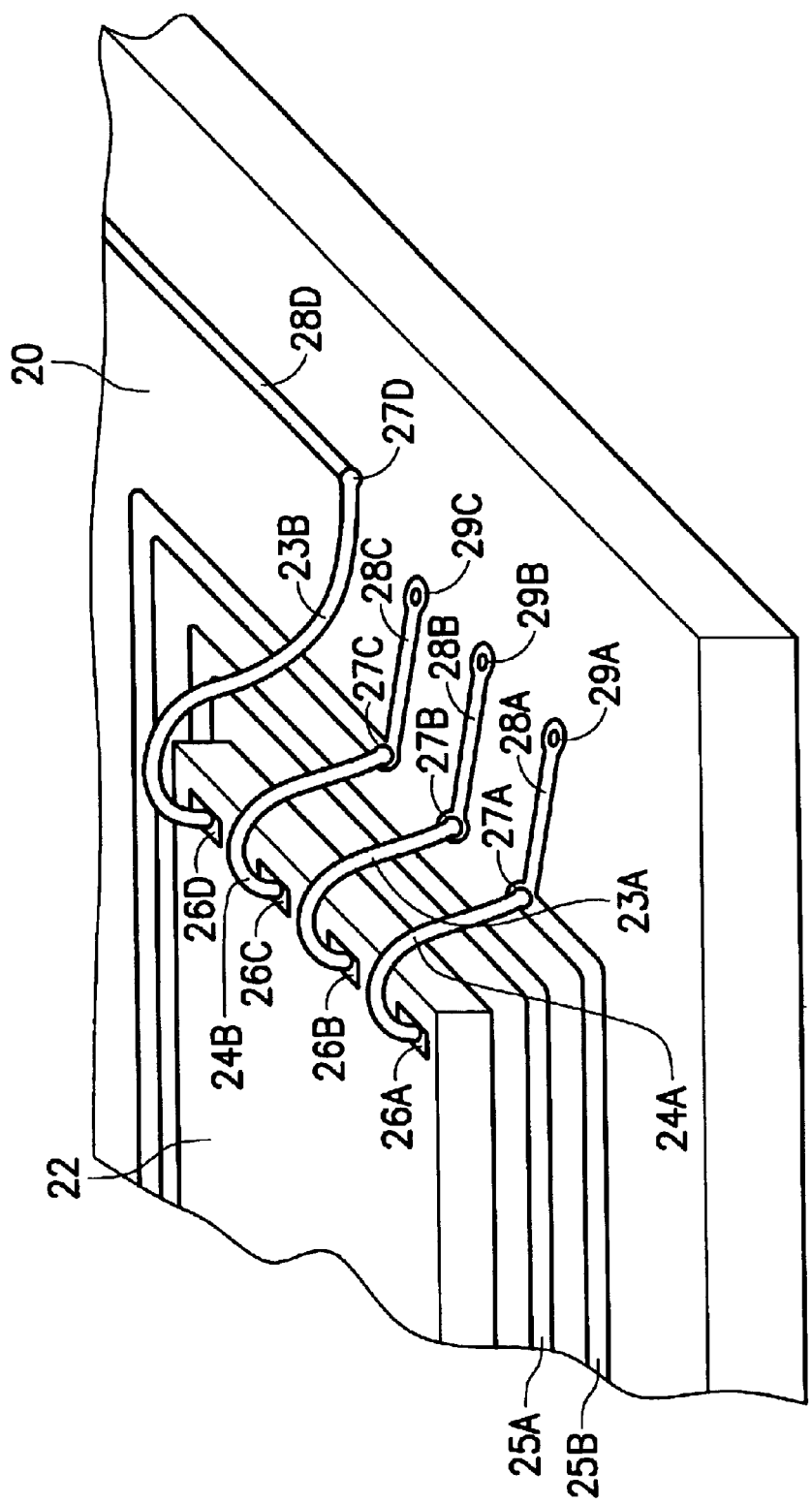
FIG. 2 is a diagram showing an integrated circuit with bonded gold lines arranged according to the embodiment of the present invention.

FIG. 2 is a diagram showing an integrated circuit with bonded gold lines arranged according to the embodiment of the present invention.

The integrated circuit comprises a substrate 20, a chip 22 and gold lines 23A, 23B, 24A and 24B. The gold lines 23A and 23B transmit the operating signals of the chip 22, such as strobe signals and clock signals. The gold lines 24A and 24B are shielding lines, and the operation of the gold lines 24A and 24B is described later.

The chip 12 has pads 26A, 26B, 26C, and 26D to output signals comprising strobe signals, clock signals, power signals, and ground. The signals are connected to the connecting points 27A, 27B, 27C, and 27D of the substrate 20 through responding gold lines. The gold line 23A is connected to the pad 26B of the chip 22 and the connection point 27B of the substrate 20, the gold line 23B is connected to the pad 26D of the chip 22 and the connection point 27D of the substrate 20, the gold line 24A is connected to the pad 26A of the chip 22 and the connection point 27C of the substrate 20, and the gold line 24B is connected to the pad 26C of the chip 22 and the connection point 27C of the substrate 20. Here, the connection points 27A and 27B are connected to the power ring 25B, the gold line 23A transmits the signals have to be shielded, and the signals transmitted by the gold line 23B are not necessary to be shielded.

According to the present invention, pads 26A and 26C are set on both sides of the pad 26B on the edge of the chip 22, and are connected to the power ring 25B through the gold lines 24A and 24B. Therefore, the path of the gold line 23A from chip 22 to substrate 20 is all between gold lines 24A and 24B. Next, on the substrate 20, the metal line 28B connected to the gold line 23A and the connection point 27B is between the metal lines 28A and 28B connected to the power ring 25B till via 29A, 29B, and 29C.

As mentioned above, the signals in the power line or ground line are stable and have larger current, so the electromagnetic waves generated from the gold line 23B are attracted to the power line or ground line. Therefore, the signal of the gold line 23A is not interfered with by the adjacent signal trace lines.

The manufacturing method of the integrated circuit according to the present invention follows. The chip 22 comprises signal pads 26B and 26D. There are shielding pads 26A and 26C are set beside the signal pad 26B. Here, if the signal output from the signal pad 26D does not require shelter, no shielding pad is situated beside the signal pad 26D.

Next, connection points 27A and 27C are formed on the substrate 20 responding to the shielding pads 26A and 26C, and the connection point 27B is formed between the connection points 27A and 27B. In addition, the metal line 28B is formed to connect to the connection point 27B, and the connection point 27D responding to the signal pad 26D is formed, however, the connection point 27D is set outside the power ring 25B.

Next, a power ring 25B is formed on the substrate 20. The power ring 25B surrounds the chip 22 and comprises metal lines 28A and 28C, set beside the metal line 28B and connected to the connection points 27A and 27C respectively.

Finally, gold lines 23A and 23B are formed connecting to the signal pads 26B and 26D and the connection points 27B and 27D. Then, the gold lines 24A and 24B are formed connecting to the connection points 27A and 27C and the shielding pads 26A and 26C respectively. Here, the gold lines 24A and 24B extend along and both sides of the gold line 26B. Therefore, the gold line 26B is shielded by the gold lines 24A and 24B connected to the power ring 25B.

The advantages of the present invention are:

1. The connection point of the signal gold line on the substrate is behind the power ring, and the gold lines adjacent to the signal trace line all transmit low-frequency power signals, so the signal in the signal gold line is not interfered with.
2. The important signal is shielded by the metal lines connected to the power to isolate the electromagnetic wave from other signal trace lines.
3. The radian of the gold line with the protected signal is different from other signal trace lines. In FIG. 2, the connection point 27B of the gold line 23A is closer to the chip 22 than the connection point 27D of the gold line 23B, so the radian of the gold line 23A is lower. Therefore, the distance between the gold line 23A and the gold line 23B is increased.
4. The signal pad of the gold line with the protected signal on the chip is set close to the edge of the chip, so the distance of the gold line is decreased to prevent signal interference.

In addition, in the present embodiment, the shielding metal lines are connected to the power ring (line). The shielding metal lines can be connected to the ground ring 25A in FIG. 2. The shelter effect is equivalent.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An integrated circuit bonding device, comprising:

a substrate having a signal connection point coupled to a via hole and two shielding connection points set at the two sides of the signal connection point;

a chip set on the substrate, wherein the edge of the chip comprises a signal pad and two shielding pads set at the two sides of the signal pad;

a signal wire bonding for coupled to the signal connection point and the signal pad;

two shielding wire bondings for coupling to the shielding connection points and the shielding pads and extending along both sides of the signal wire bonding;

a signal trace line set on the substrate and coupled to the signal connection point and the via hole; and a power ring circuit set on the substrate and coupled to the shielding connection points, wherein the power ring circuit further comprises two shielding lines extending along both sides of the signal trace line.

2. The integrated circuit bonding device as claimed in claim 1, wherein the signal pad outputs high frequency signals.

3. The integrated circuit bonding device as claimed in claim 1, wherein the power ring circuit is coupled to ground level.

4. The integrated circuit bonding device as claimed in claim 1, wherein the power ring circuit is coupled to the power line.

* * * * *